United States Patent
Bet et al.

(10) Patent No.: US 6,840,819 B2
(45) Date of Patent: Jan. 11, 2005

(54) ELECTRICAL APPARATUS TO BE FITTED TO A TOP HAT RAIL

(75) Inventors: Robert Bet, Velars s/Ouche (FR); Frédéric Delvaux, Dijon (FR); Michel Girard, Corcelles-les-Citeaux (FR); Philippe Rix, Dijon (FR)

(73) Assignee: Schneider Automation Inc., North Andover, MA (US)

( * ) Notice: Subject to any disclaimer, the term of this patent is extended or adjusted under 35 U.S.C. 154(b) by 87 days.

(21) Appl. No.: 10/349,963

(22) Filed: Jan. 24, 2003

(65) Prior Publication Data

US 2003/0143896 A1 Jul. 31, 2003

(30) Foreign Application Priority Data

Jan. 25, 2002  (FR) ............................................. 02 01002

(51) Int. Cl.[7] ................................................. H01R 9/26
(52) U.S. Cl. .......................... 439/716; 439/94; 439/532; 439/157
(58) Field of Search ................................ 439/716, 715, 439/94, 532, 157

(56) References Cited

U.S. PATENT DOCUMENTS

| | | | | |
|---|---|---|---|---|
| 5,090,922 A | * | 2/1992 | Rymer et al. ................ | 439/716 |
| 5,145,418 A | * | 9/1992 | Moranski et al. ............ | 439/716 |
| 5,192,227 A | * | 3/1993 | Bales .......................... | 439/532 |
| 5,362,259 A | * | 11/1994 | Bolliger ....................... | 439/716 |
| 5,602,363 A | * | 2/1997 | Von Arx ...................... | 174/52.1 |
| 5,820,420 A | * | 10/1998 | Bechaz et al. .............. | 439/716 |
| 6,146,213 A | * | 11/2000 | Yoon ........................... | 439/716 |

FOREIGN PATENT DOCUMENTS

EP  0 740 499  10/1996

* cited by examiner

*Primary Examiner*—Tho D. Ta
(74) *Attorney, Agent, or Firm*—Oblon, Spivak, McClelland, Maier & Neustadt, P.C.

(57) ABSTRACT

An electrical apparatus including a base configured to be fitted to a holding rail with opposing coplanar arms, and configured to accommodate a component member of the apparatus and fitted with a locking device having two opposing catches each intended to hook onto a respective arm of the rail. Further, at least one of the two catches is joined to a slide configured to slide in a direction and can be moved by a manual unlocking member. In addition, he manual unlocking member includes a lever pivoted around at least one bearing pin having an axis perpendicular to the sliding direction of the slide, and the lever cooperates with the slide bar via a cam device guiding through a slide track having an axis parallel to the axis of the bearing pin.

11 Claims, 4 Drawing Sheets

ELECTRICAL APPARATUS TO BE FITTED TO A TOP HAT RAIL

BACKGROUND OF THE INVENTION

1. Field of the Invention

This invention concerns an electrical apparatus comprising a base to be fitted to a holding rail, in particular a top hat rail, with opposing coplanar arms, the base being fitted with a locking system having two opposing fastening catches each intended to hook onto a respective arm of the rail, at least one of the catches being joined to a slide capable of sliding in a specific direction, crosswise to the length of the rail, and which can be moved using a manual unlocking device.

2. Discussion of the Background

Document FR 2 730 353 shows a device for locking an electrical system on a holding rail, this device comprising two catches interlinked by a spacer frame of which the elastic deformation may be caused via a pull tab accessible from the front. The device is disengaged from the rail via a lateral pull tab that is not easy to operate. Moreover, this device cannot suitably and securely accommodate another device being a part of an electrical apparatus having a base, in particular a processing module, a terminal unit, etc., removably fixed to the base.

SUMMARY OF THE INVENTION

The purpose of the invention is to fix a base to a holding rail but enable the base to be unlocked, on the one hand, via a user-friendly system and, on the other hand, using means capable of securing the addition of another component member of the apparatus on the base.

According to the invention, the manual unlocking device comprises a lever pivoted around at least one bearing having an axis perpendicular to the sliding direction of the slide, the bearing being, in particular, located near the back side of the base, and the lever cooperates with the slide via a cam device fitted with a slide track guiding an axis parallel to the axis of the bearing. The lever can preferably be maintained by holding means in its locking and unlocking positions.

In this way, the lever can offer a manoeuvring arm which is unobtrusive in the locking position and projects forward in the unlocking position, in order to cooperate with the rear side of the module, to prevent mounting of the module on the base in the unlocking position and enable it to be mounted in the locking position. The two catches are preferably movable, by being joined to slides symmetrical relation to a mid-plane of the base, the lever cooperating with the slides via two symmetrical cams and axes.

slide track should preferably be integrated into the lever and the slide is provided with the axis guided in the slide track, this axis being guided in a slit or groove in the base which extends in accordance with the sliding direction of the slide.

Where the base comprises rigid back walls, it is advisable for the slide to be moulded with the back, and to be separated from rigid back walls by slits. The back may have two hollow parts intended to accommodate the arms of the top hat rail and the lever part fitted with cam sliding tracks projects backwards between the hollow parts.

BRIEF DESCRIPTION OF THE DRAWINGS

There is a description below of an embodiment of the invention, accompanied by attached drawings

DESCRIPTION OF THE PREFERRED EMBODIMENTS

The apparatus illustrated in the figures comprises several electronic modules 10 to be nested or otherwise fitted and snapped onto the individual bases 20 which can themselves be adjacently snap-locked via all usual means on to a top hat holding rail. As a variant, several modules 10 can be nested in the adjacent housing spaces arranged in a same and unique base. The top hat rail R has a standard rail section with two opposing arms R1, R2 and extends along a direction X. When the system is in its operating mode, the module is fitted to the base.

Figure 1:
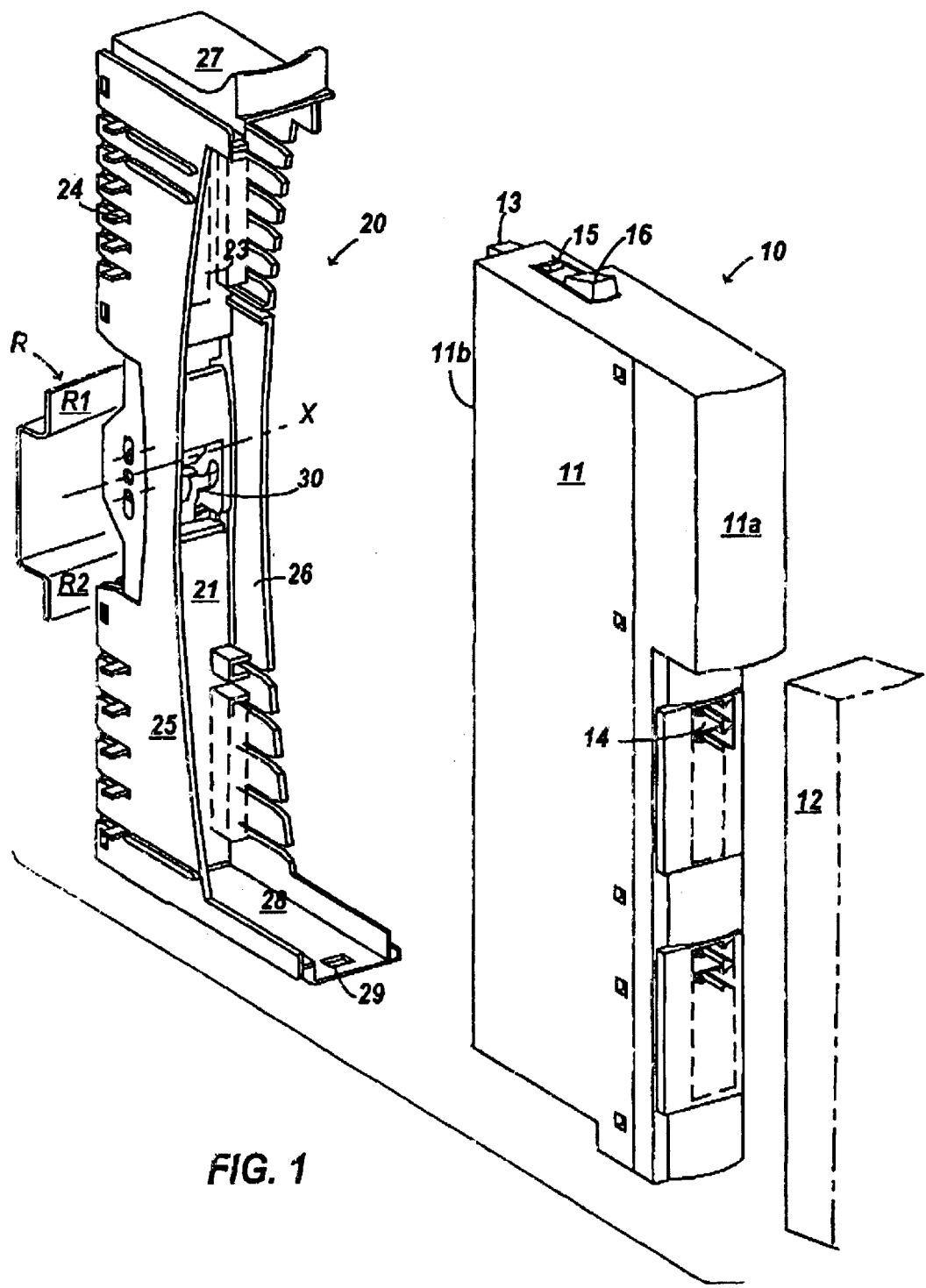
FIG. 1 shows an exploded view of a modular apparatus in accordance with the invention.

As shown in FIG. 1. each module 10 comprises a casing 11 with a front side 11a and a rear side 11b. On the front side 11a can be fitted a terminal block 12 for external connection to automatism electrical members to be controlled or monitored, connections 14 being provided on the front side 11a to cooperate with respective connections or contacts on the terminal block 12. Rear contacts or connection elements 13 are provided on the rear side 11b of the casing.

The base 20 determines a housing for the rear section of the module 10. It comprises a back 21, lateral walls in the form of vertical partitions 25, 26 and an upper wall (27 and lower wall 28, both horizontal. The base 21 is fitted with an elastic locking device 30 to be fastened on the rail R.

The back 21 has front connections 23 adapted to cooperate with the contacts 13 of module 10 when the base is locked on the rail R. The base also has lateral contacts 24 which are used to transmit bus signals to or from the modules and supply voltage for the modules or the automation members. The walls 25–28 comprise faces, slide elements or other guiding elements facilitating the introduction of the module. The partitions 25, 26 are provided with recesses 29 which cooperate with ratchets, elastic parts or other securing forms 15 provided on the module 10. The forms 15 can be manoeuvred, for example, via two upper and lower pushers, 16 in order to lock the module 10 in a position embedded in the base 20, and in this position the module fits between the walls 25–28.

Figure 2:
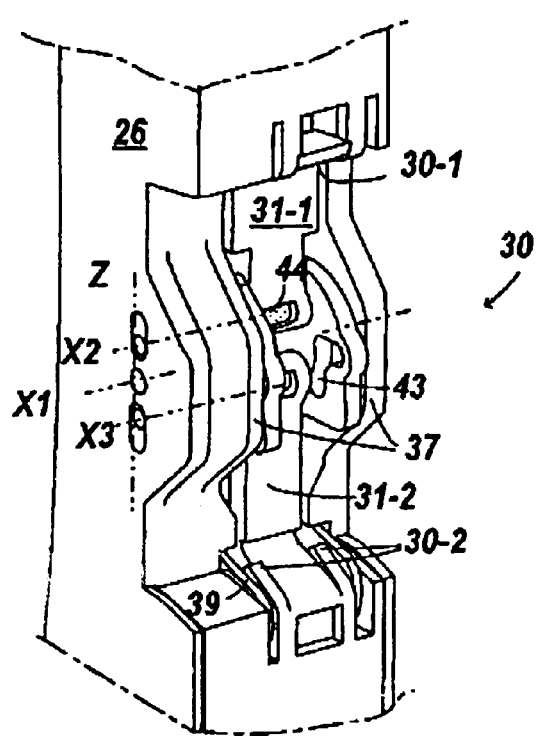
FIG. 2 shows a rear view of the central section of the base of the apparatus shown in FIG. 1.
Figure 6:
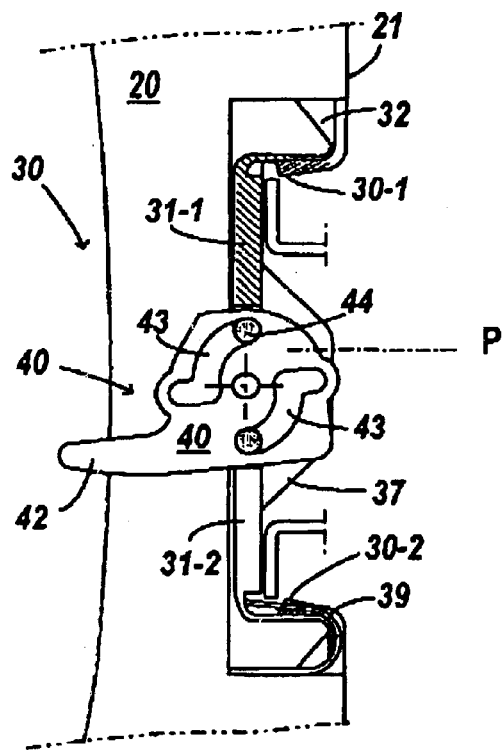
Figure 7:
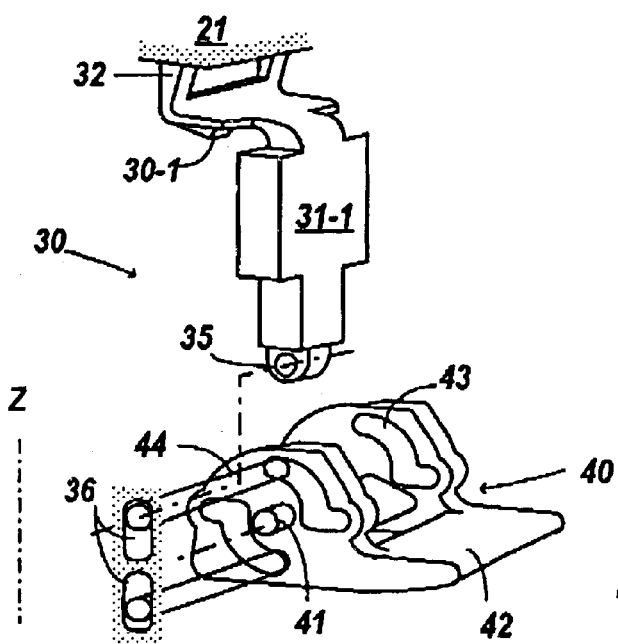
FIG. 7 is an exploded view showing lever and one of the slides combined with the lever.

As shown in FIG. 2 the locking device 30 comprises two opposing securing catches 30, (30-1, 30-2), each linked to a slide 31, (31-1, 31-2), such as a bar or tab, which can be moved in a vertical direction Z, corresponding to the length of the base 20, and which runs perpendicular to X. At the end opposite to the mid-plane P of the base, each slide is connected to a rigid section 32 (see FIG. 6) of the baseback 21 in the form of a hinged connection, this connection, how-ever, allowing movement of the slide. The slide 31 is made up of a section of the base 21, separated from rigid partitions 33 of the back by slits 34 extending in direction Z.

Figure 3:
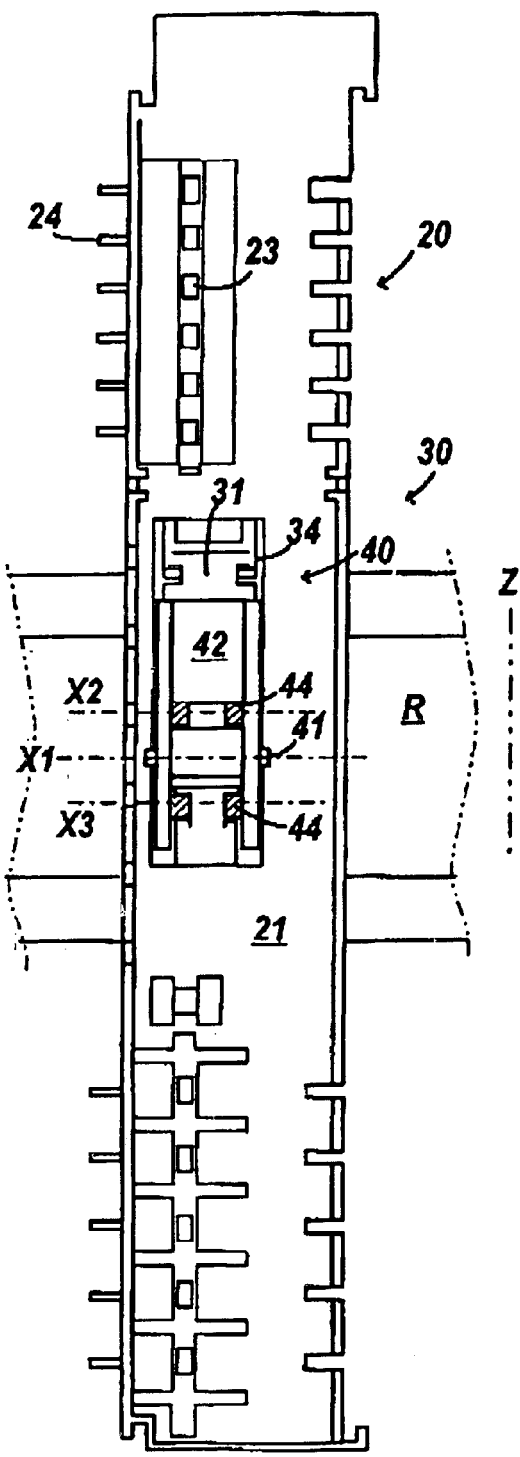
FIG. 3 is a front view of the base with the lever in the locking position.

As shown in FIG. 3, the locking device 30 comprises an unlocking system made up of a lever 40 pivoted around a bearing axis X1 parallel to direction X. The lever 40 offers, to this end, lateral bearing pins 41 pins 41 pivoted in apertures of the back 21. The lever has a manual control arm 42 and a main pivot body fitted with two cam slide tracks 43 in each of which an axis 44 can be moved along a direction X2, X3 parallel to X and engaged, on the one hand, in a cylindrical hole 35 of the respective slide 31 and, on the other hand, in oblong grooves or slits 36, extending in direction Z, and provided for in lugs 37 of the back. The lugs 37 and main pivot body with the slide tracks 43 project backwards into an intermediate area between the housing zones 38 for the rail R1, R2, this projection being housed in the central recess of the rail. The lever thus occupies a very small space in the back part of the base.

A return pin spring 39 is associated to one of the slides 31-2, and buttressed against such slide to push it towards plane P.

Figure 4:
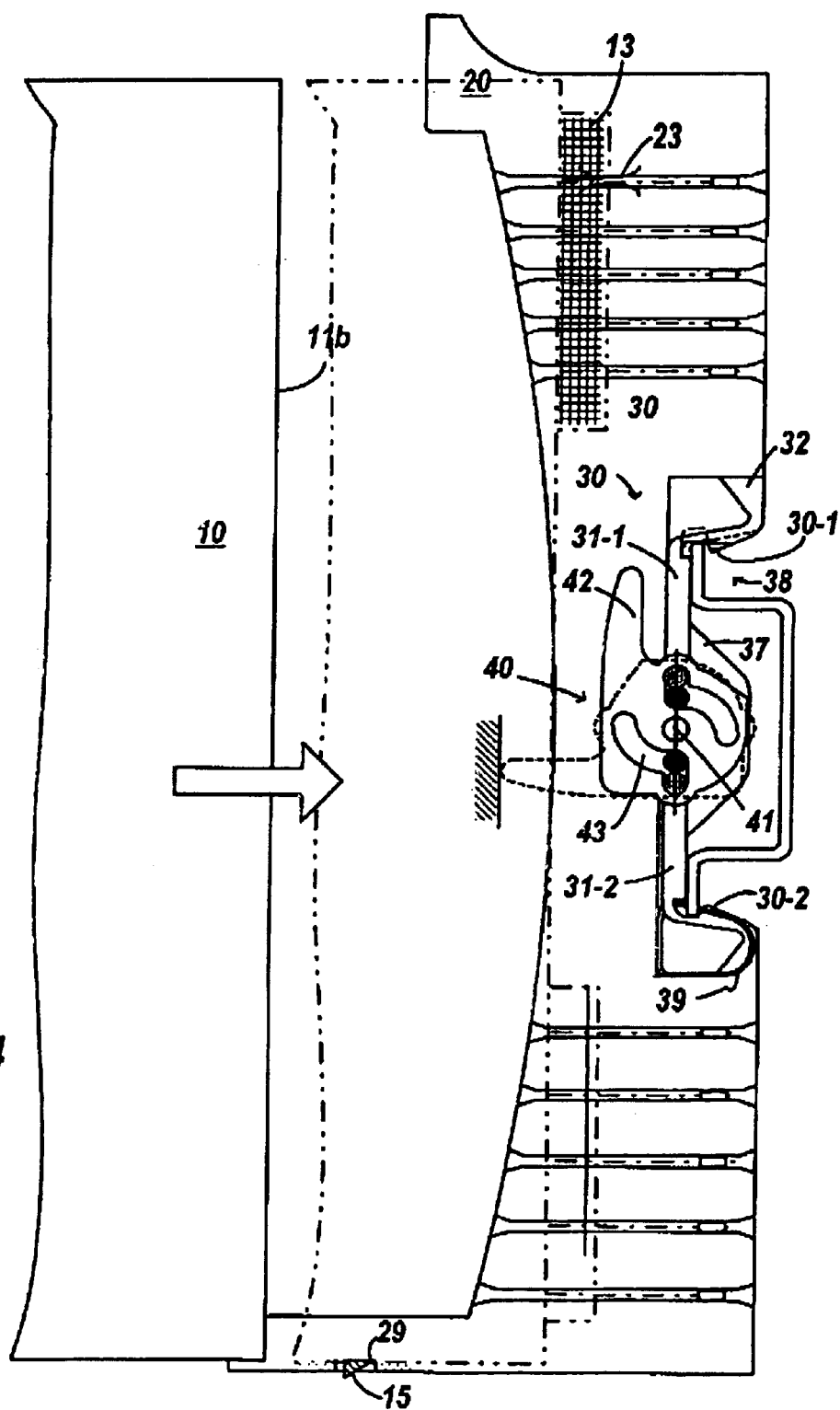
FIG. 4 is a side view of the base the lever being shown in its locking position (in full lines) and in its unlocking position (in broken lines).
Figure 5:
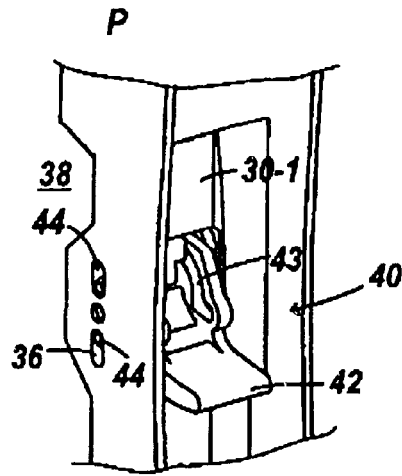
FIGS. 5 and 6 show front and side views of the unlocked lever.

As FIG. 4 shows, the rear wall 11b of the electronic module abuts against the operating arm 42 of the lever 40 when the lever is in its generally horizontal unlocking position (depicted in broken lines). The wall 11b, however, allows the module to be secured to the base and connection of contacts 13 and 21 when the arm 42 is moved to its generally vertical locking position (in full lines). Similarly, when the module is fixed and connected, the base 20 cannot be unlockedfrom the rail R.

The operation of the locking device described is then specified in conjunction with FIGS. 4 to 7.

As the lever 40 is in the unlocking position (FIGS. 5 and 6, or broken lines in FIG. 4) and is held in this position via stress-threshold hard or snap-lock elements, the slides are then separated (see position shown in broken lines in FIG. 4) and the base can thus be applied on the arms of rail R; the operator can thus pivot the lever into its locking position (see position in broken lines in FIG. 4) and the slides hook onto the edges of the arms, this movement being assisted by spring 38. The lever is held in this position by a hard or snap-lock element. The module can then be engaged into the base and connected and secured to it insofar as the lever 40 is in the unlocked position, it is not possible to slide and connect the electronic module 10 in the base 20 (see this position as illustrated in broken lines in FIG. 4).

What is claimed is:

1. An electrical apparatus comprising:
a base configured to be fitted to a holding rail, with opposing coplanar arms, and configured to accommodate a component member of the apparatus and fitted with a locking device having two opposing catches each intended to hook onto a respective arm of the rail, at least one of the two catches being joined to a slide configured to slide in a direction and which can be moved by a manual unlocking member,
wherein
the manual unlocking member comprises a lever pivoted around at least one bearing pin having an axis perpendicular to the sliding direction of the slide, and
the lever cooperates with the slide bar via a cam device guiding through a slide track having an axis parallel to the axis of the bearing pin.

2. The electrical apparatus according to claim 1, wherein the two catches are movable, and are joined to corresponding slides that are symmetrical in relation to a mid-plane of the base, and the lever cooperates with the corresponding slides via two cams and symmetrical axes.

3. The electrical apparatus according to claim 1, wherein the base comprises a rigid back wall and the corresponding slide is moulded with the back wall, and the slide is separated from rigid partitions of the back wall by slits.

4. The electrical apparatus according to claim 1, wherein the lever is held in its unlocking position and its locking position via a force-threshold securing system.

5. The electrical apparatus according to claim 1, further comprising an electronic module removably fastened to the base, the lever having a manoeuvring arm which is unobtrusive in a locking position and projects forward in an unlocking position, in order to cooperate with a rear side of the electronic module to prevent the electronic module to be mounted on the base in the unlocking position and enabling the module to be mounted in the locking position.

6. The electrical apparatus according to claim 1, wherein the holding rail is a top hat rail.

7. The electrical apparatus according to claim 1, wherein the lever is integrated into a cam sliding track and the corresponding slide comprises the axis guided in the sliding track.

8. The electrical apparatus according to claim 7, wherein the axis of the corresponding slide is guided in a slit or groove in the base, and which extends in the sliding direction of the slide.

9. The electrical apparatus according to claim 1, wherein the bearing pin of the lever is located near a, back wall of the base.

10. The electrical apparatus according to claim 9, wherein a return pin spring is associated to one of the corresponding slides.

11. The electrical apparatus according to claim 9, wherein the back wall offers two housing spaces configured to accommodate the opposing coplanar arms of the holding rail and the lever provided with the cam slide tracks projects backwards between the two housing spaces.

* * * * *